United States Patent
Bojarczuk, Jr. et al.

(10) Patent No.: US 6,891,231 B2
(45) Date of Patent: May 10, 2005

(54) COMPLEMENTARY METAL OXIDE SEMICONDUCTOR (CMOS) GATE STACK WITH HIGH DIELECTRIC CONSTANT GATE DIELECTRIC AND INTEGRATED DIFFUSION BARRIER

(75) Inventors: Nestor Alexander Bojarczuk, Jr., Poughkeepsie, NY (US); Kevin Kok Chan, Staten Island, NY (US); Christopher Peter D'Emic, Ossining, NY (US); Evgeni Gousev, Mahopac, NY (US); Supratik Guha, Chappaqua, NY (US); Paul C. Jamison, Hopewell Junction, NY (US); Lars-Ake Ragnarsson, New York, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/879,105

(22) Filed: Jun. 13, 2001

(65) Prior Publication Data

US 2002/0190302 A1 Dec. 19, 2002

(51) Int. Cl.$^7$ .................. H01L 29/76; H01L 29/94; H01L 31/062; H01L 31/113; H01L 31/119
(52) U.S. Cl. .................. 257/368; 257/412; 257/310
(58) Field of Search .................. 257/310, 368, 257/382–412, 371–374; 438/300–305, 198–216, 142, 287

(56) References Cited

U.S. PATENT DOCUMENTS

| | | | | | |
|---|---|---|---|---|---|
| 5,763,922 | A | * | 6/1998 | Chau | 257/371 |
| 6,013,553 | A | | 1/2000 | Wallace et al. | |
| 6,020,024 | A | * | 2/2000 | Maiti et al. | 438/287 |
| 6,020,243 | A | | 2/2000 | Wallace et al. | |
| 6,107,667 | A | * | 8/2000 | An et al. | 257/408 |
| 6,277,681 | B1 | * | 8/2001 | Wallace et al. | 438/198 |
| 6,340,827 | B1 | * | 1/2002 | Choi et al. | 257/410 |
| 6,383,873 | B1 | * | 5/2002 | Hegde et al. | 438/287 |
| 6,407,435 | B1 | * | 6/2002 | Ma et al. | 257/411 |
| 6,429,052 | B1 | * | 8/2002 | Gardner et al. | 438/142 |

OTHER PUBLICATIONS

U.S. Appl. No. 09/755,164, filed Jan. 8, 2001.

* cited by examiner

*Primary Examiner*—Cuong Nguyen
(74) *Attorney, Agent, or Firm*—Wan Yee Cheung, Esq.; McGinn & Gibb, PLLC

(57) ABSTRACT

A diffusion barrier (and method for forming the diffusion barrier) for a field-effect transistor having a channel region and a gate electrode, includes an insulating material being disposed over the channel region. The insulating material includes nitrogen (N), and is disposed under the gate electrode. The insulating material can be provided either as a layer or distributed within a gate dielectric material disposed under the gate electrode.

18 Claims, 1 Drawing Sheet

COMPLEMENTARY METAL OXIDE SEMICONDUCTOR (CMOS) GATE STACK WITH HIGH DIELECTRIC CONSTANT GATE DIELECTRIC AND INTEGRATED DIFFUSION BARRIER

CROSS-REFERENCE TO RELATED APPLICATION

The present application is related to U.S. patent application Ser. No. 09/755,164, filed on Jan. 8, 2001, to Guha et al., entitled "ALUMINUM NITRIDE AND ALUMINUM OXIDE/ALUMINUM NITRIDE HETEROSTRUCTURE GATE DIELECTRIC STACK BASED FIELD EFFECT TRANSISTORS AND METHOD FOR FORMING SAME" assigned to the present assignee, and incorporated herein by reference.

BACKGROUND OF THE INVENTION

1. Field of the Invention

The present invention relates to a gate stack, and more particularly to a CMOS gate stack with a high dielectric constant gate dielectric and integrated diffusion barrier.

2. Description of the Related Art

Beyond the 100 nm CMOS technology node, device scaling has been difficult and is now believed to require the introduction of new insulators into the gate stack.

That is, previously, the incorporation of nitrogen into $SiO_2$ gate dielectrics has been attempted to reduce dopant diffusion. In this case, the prevalent method to form the structure has been thermal processing in $O_2$, $N_2O$, and NO gases. By varying the sequence of gases, structures with different nitrogen profiles (e.g., near top, near bottom) can be manufactured. Also, nitrogen implantation into the Si substrate prior to thermal oxidation has been used.

Oxide/nitride stacks have also been used where the nitride has been deposited onto a thermally grown oxide. However, the methods to form the structures have been problematic in most cases. Indeed, thermal processing in $N_2O$, NO gas may not be possible for many of the materials currently contemplated because of thermal budget constraints.

Thus, beyond the 100 nm CMOS technology node, device scaling requires the introduction of new insulators into the gate stack and a new methodology. These materials, generally referred to as "high-K" dielectrics, should have a dielectric constant which is larger than that of conventional $SiO_2$ gate oxide, and more specifically a insulation constant (permittivity) which is in a range of approximately 4 to 100. These high-K dielectrics include binary metal oxides such as $Al_2O_3$, $HfO_2$, $ZrO_2$, $TiO_2$, $La_2O_3$, $Y_2O_3$, $Gd_2O_3$, $Ta_2O_5$, and their silicates and aluminates. It is noted that the term "high-K dielectrics" refers to materials having a greater permittivity of the material (e.g., a greater insulation characteristic).

In CMOS devices, the high-K dielectric electrically separates the heavily (n or p-type) doped poly-Si or the metal gate from the active region (channel) of the device.

Device fabrication and operation require gate dielectric robustness with respect to thermal reactions between the poly-Si (or metal) gate and the high-K layer, resistance to dopant (e.g. B, P, As, etc.) or metal diffusion from the gate, and resistance to moisture or oxygen diffusion through the gate dielectric to prevent oxidation of the silicon near the active region of the device.

However, prior to the invention, no such method and structure has been developed providing such gate dielectric robustness. That is, while there are some high K gate dielectrics that are being developed, no robustness has been shown thereby. Indeed, work has been performed on such dielectrics by attempting to add some resistance to such dielectrics either by adding something on the dielectric layer or spreading some material through the layer or by incorporating nitrogen or the like into the layer. Indeed, the conventional methods have focused on either using silicon dioxide and nitrogen in the gate dielectric. Another method has attempted to incorporate aluminum nitride into the gate dielectric layer.

However, again, not robustness has been shown by such method, as would be advantageous as discussed above.

SUMMARY OF THE INVENTION

In view of the foregoing and other problems, disadvantages, and drawbacks of the conventional methods and structures, an object of the present invention is to provide a structure (and method for forming the structure) having an integrated diffusion barrier at the gate electrode/high-K interface (i.e., poly-Si (or metal) gate electrode/diffusion barrier/high-K layer/Si wafer).

Another object is to provide a structure with the diffusion barrier integrated either homogeneously or inhomogeneously within the body of the gate dielectric.

Yet another object is to provided materials and processes of forming such structures.

In a first aspect of the present invention, a field effect transistor is provided which includes a substrate including a source region, a drain region, and a channel region therebetween, an insulating layer being disposed over the channel region, the insulating layer being selected from $Al_2O_3$, $HfO_2$, $ZrO_2$, $TiO_2$, $La_2O_3$, $Y_2O_3$, $Gd_2O_3$, $Ta_2O_5$, silicates thereof and aluminates thereof, the insulating layer including nitrogen (N), and a gate electrode disposed over the insulating layer.

In a second aspect of the present invention, a diffusion barrier for a field-effect transistor having a channel region and a gate electrode, includes an insulating layer being disposed over the channel region, the insulating layer including nitrogen (N), and being disposed under the gate electrode.

In a third aspect of the present invention, a method of blocking diffusion of impurities into an insulating layer disposed over a channel region of a field effect transistor, the insulating layer being selected from $Al_2O_3$, $HfO_2$, $ZrO_2$, $TiO_2$, $La_2O_3$, $Y_2O_3$, $Gd_2O_3$, $Ta_2O_5$, and silicates and aluminates thereof, the method including one of: infusing nitrogen atoms into said insulating layer; nitridation of the insulating layer; and depositing a layer of a nitrogen compound over the insulating layer.

In a fourth aspect of the present invention, a diffusion barrier for a field-effect transistor including a channel region and a gate electrode, includes a dielectric layer being disposed over the channel region, the dielectric layer having nitrogen dispersed therein.

With the unique and unobvious aspects of the present invention, an integrated diffusion barrier is provided at the gate electrode/high-K dielectric interface. Further, the diffusion barrier is integrated either homogeneously or inhomogeneously within the body of the gate dielectric.

As s result, device fabrication is optimized in that gate dielectric robustness are advantageously provided with respect to thermal reactions between the poly-Si (or metal) gate and the high-K layer, resistance to dopant or metal diffusion from the gate, and resistance to moisture or oxygen diffusion through the gate dielectric to prevent oxidation of the silicon near the active region of the device.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
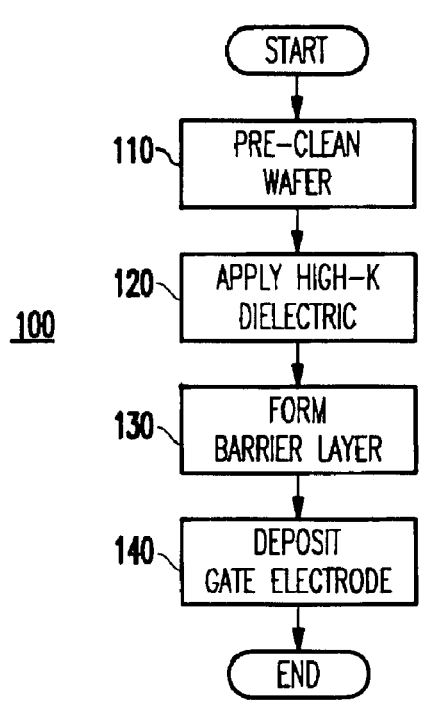
FIG. 1 illustrates a flowchart of a method 100 for forming a diffusion barrier according to the present invention.

Referring now to the drawings, and more particularly to FIGS. 1–5, there are shown preferred embodiments of the method and structures according to the present invention. It is noted that, for the reader's clarity, throughout the Figures the same reference numerals are shown to denote like elements.

Generally, the invention aims to place an ultra-thin (5–10 Å) barrier layer on top of the high-K layer (i.e., between the high-K layer and gate electrode) that helps to prevent reaction(s) between the gate electrode and the high-K layer, and also acts as a diffusion barrier against dopant, metal, and/or oxygen and moisture penetration from the gate electrode.

Figure 2:
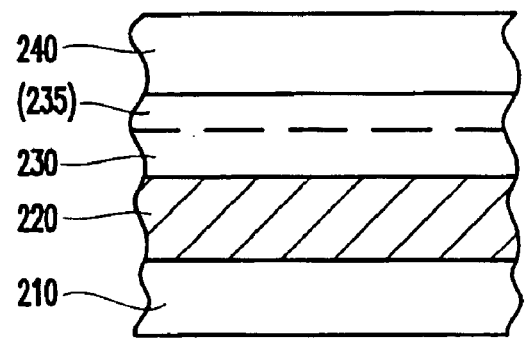
FIG. 2 illustrates a structure formed by the method of FIG. 1 in which the barrier layer 230 is formed of one compound, or as a combination of two or more layers 230, 235.

Turning now to FIG. 1, a process flow 100 for forming the device (e.g., gate stack) is described hereinbelow. The structure formed by the process 100 is shown in FIG. 2.

First, in step 110, a pre-cleaning of an underlying substrate (wafer) 210 is performed. Such a wafer pre-cleaning is known in the art and will not be described herein in detail. The substrate may be formed of silicon or any other suitable material depending upon the device being fabricated.

In step 120, a high-K layer 220 is deposited on the substrate 210.

Next, in step 130, a barrier layer 230 is formed on the high-K layer. That is, an ultra-thin (e.g., preferably having a thickness of approximately 2–15 Å) barrier layer on top of the high-K layer (i.e., between the high-K layer and a gate electrode). The barrier layer 230 is for preventing reaction(s) between the gate electrode (to be formed subsequently) and the high-K layer 220, and also acts as a diffusion barrier against dopant, metal, and/or oxygen and moisture penetration from the gate electrode.

Such a barrier layer 230 can be formed of one compound that acts as a diffusion barrier for all the items listed above, or as a combination of two or more layers 230, 235 (as shown in FIG. 2) that, together, are designed to provide diffusion barrier functionality for all of the above listed items.

Figure 3:
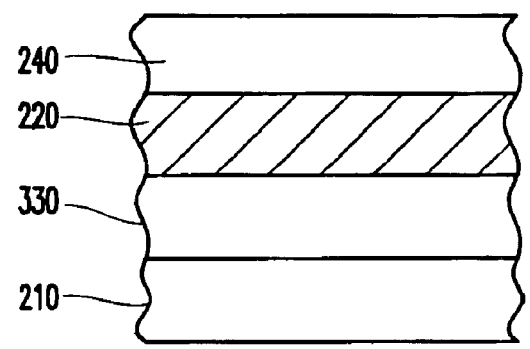
FIG. 3 illustrates a diffusion barrier layer 330 which can be added adjacent to a wafer surface.

Alternatively, as shown in FIG. 3, the diffusion barrier layer 330 can be added adjacent to the Si wafer surface as shown at reference numeral 330.

Figure 4:
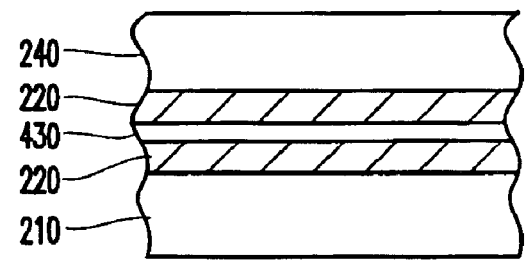
FIG. 4 illustrates another modification of the diffusion barrier layer in which the barrier layer resides within a gate dielectric layer 230 as a distinct sublayer 430.

As yet another alternative, the diffusion barrier layer may reside within the gate dielectric layer 220 as a distinct sublayer 430, as shown in FIG. 4, that is therefore physically not adjacent to the gate electrode. In this case, the functionality will be as a diffusion barrier, rather than as a layer that prevents reaction with the gate electrode 240.

Figure 5:
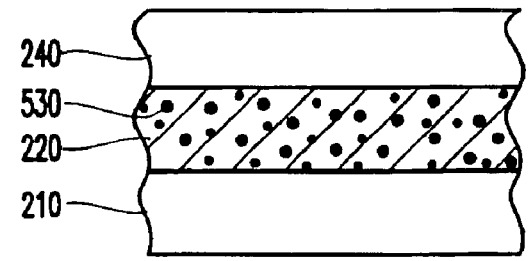
FIG. 5 illustrates yet another modification of the diffusion barrier provided by distributing an additive element 530 or compound within the entire gate dielectric layer 230.

Further, as shown in FIG. 5, the diffusion barrier functionality may be brought about by distributing an additive element 530 or compound within the entire gate dielectric layer 220.

The choice of materials for the diffusion/reaction barrier includes (but is not limited to) nitride or oxynitride compounds (that exhibit dielectric behavior), such as aluminum nitride (oxynitride), silicon nitride (oxynitride), etc.

It is noted that the barrier layer 230, 330, etc. can be formed by a variety of techniques. For example, the barrier layer can be formed plasma assisted processing (e.g., by direct or remote plasma nitridation of the high-K layer in nitrogen-containing ($N_2$, $NH_3$, etc.) plasma.

Alternatively, the barrier layer can be formed by chemical vapor deposition in low pressure (LPCVD), rapid thermal (RTCVD), atomic layer (ALCVD) or plasma enhanced (PECVD) modes.

Moreover, the barrier layer can be formed by physical vapor deposition (e.g., molecular beam epitaxy (MBE)), or can be formed by ion implantation into the gate oxide.

Returning to FIGS. 1 and 2, a final step is depositing the gate electrode 240 over the diffusion barrier layer. Again, the gate electrode can be deposited on the diffusion barrier layer as shown in FIGS. 2–3 or on top of the gate dielectric layer as shown in FIGS. 4–5. Such a step is believed to be well-known and will not be further described herein.

Depending on the position of the barrier layer (e.g., on top of, on the bottom of, inside of the gate dielectric etc.), the process sequence must be changed accordingly. If a constituent with diffusion blocking properties is added to the gate dielectric material either homogeneously or inhomogeneously (e.g., near the top or near the bottom, or within, as a layer with different composition), barrier layer formation and gate deposition occur simultaneously.

Thus, as described above, with the present invention, an integrated diffusion barrier is provided at the gate electrode/high-K dielectric interface. The diffusion barrier is integrated either homogeneously or inhomogeneously within the body of the gate dielectric.

As s result, device fabrication is optimized in that gate dielectric robustness are advantageously provided with respect to thermal reactions between the poly-Si (or metal) gate and the high-K layer, resistance to dopant or metal diffusion from the gate, and resistance to moisture or oxygen diffusion through the gate dielectric to prevent oxidation of the silicon near the active region of the device.

While the invention has been described in terms of several preferred embodiments, those skilled in the art will recognize that the invention can be practiced with modification within the spirit and scope of the appended claims.

Having thus described our invention, what we claim as new and desire to secure by Letters Patent is as follows:

1. A field effect transistor comprising:
   a substrate comprising a source region, a drain region, and a channel region therebetween;
   an insulating layer being disposed over said channel region, said insulating layer comprising at least one member selected from the group consisting of $Al_2O_3$, $HfO_2$, $ZrO_2$, $TiO_2$, $La_2O_3$, $Y_2O_3$, $Gd_2O_3$, $Ta_2O_5$, silicates thereof and aluminates thereof;

a barrier layer having a thickness in a range from about 5 Å to 10 Å, and comprising a plurality of adjacent layers formed on said insulating layer, said barrier layer comprising at least one member selected from the group consisting of aluminum oxynitride, aluminum nitride and silicon nitride; and a polysilicon gate electrode formed on said barrier layer, said barrier layer inhibiting a diffusion of dopants from said polysilicon gate electrode to said insulating layer.

2. The field effect transistor according to claim 1, wherein said barrier layer comprises a diffusion barrier layer.

3. The field effect transistor according to claim 1, wherein said insulating layer comprises a high-K dielectric insulating layer.

4. The field effect transistor according to claim 1, wherein said barrier layer comprises two layers.

5. The field effect transistor according to claim 3, wherein said barrier layer prevents a reaction between the gate electrode and the high-K layer, and acts as a diffusion barrier against oxygen and moisture penetration from the gate electrode.

6. The field effect transistor according to claim 1, wherein said barrier layer prevents a thermal reaction between said gate electrode and said insulating layer.

7. The field effect transistor according to claim 2, wherein said barrier layer comprises one compound.

8. The field effect transistor according to claim 2, wherein said barrier layer includes a combination of two or more layers that, together, provide a diffusion barrier functionality.

9. The field effect transistor according to claim 1, wherein said gate electrode is formed directly on said barrier layer.

10. The field effect transistor according to claim 1, wherein said substrate comprises a silicon substrate, and wherein said insulating layer is formed directly on said substrate.

11. The field effect transistor according to claim 1, wherein said barrier layer comprises a water and oxygen barrier.

12. The field effect transistor according to claim 1, wherein said barrier layer comprises at least one member selected from the group consisting of aluminum oxynitride and silicon nitride.

13. The field effect transistor according to claim 1, wherein said insulating layer comprises at least one member selected from the group consisting of $Al_2O_3$, $HfO_2$, $Y_2O_3$, $Gd_2O_3$, silicates thereof and aluminates thereof.

14. A field effect transistor comprising:

a substrate comprising a channel region;

a high-k dielectric insulating layer formed over said channel region;

a barrier layer having a thickness in a range from about 5 Å to 10 Å, and comprising a plurality of adjacent layers formed on said insulating layer, said barrier layer comprising at least one member selected from the group consisting of aluminum oxynitride, aluminum nitride and silicon nitride; and a polysilicon gate electrode formed on said barrier layer, said barrier layer inhibiting a diffusion of dopants from said polysilicon gate electrode to said insulating layer.

15. The field effect transistor of claim 14, wherein said barrier layer comprises a barrier against oxygen and moisture penetration from the gate electrode.

16. A field effect transistor comprising:

a substrate comprising a channel region;

an insulating layer disposed over said channel region, said insulating layer comprising:

a first layer comprising at least one member selected from the group consisting of $Al_2O_3$, $HfO_2$, $ZrO_2$, $TiO_2$, $La_2O_3$, $Y_2O_3$, $Gd_2O_3$, $Ta_2O_5$, silicates thereof, aluminates thereof, an aluminum oxide silicate, a titanium oxide silicate, a titanium oxide aluminate, a tantalum oxide silicate, and a tantalum oxide aluminate; and a plurality of adjacent second layers formed on said first layer, said plurality of adjacent second layers having a combined thickness in a range from about 5 Å to 10 Å, and comprising at least one member selected from the group consisting of aluminum oxynitride, aluminum nitride and silicon nitride; and a polysilicon gate electrode formed on said insulating layer, said plurality of adjacent second layers inhibiting a diffusion of dopants from said polysilicon gate electrode to said first layer of said insulating layer.

17. The field effect transistor according to claim 16, wherein said first layer comprises a high-k dielectric layer and said plurality of adjacent second layers comprises a barrier layer.

18. The field effect transistor according to claim 17, wherein said barrier layer is formed directly on said high-K dielectric layer.

* * * * *